US012674973B2

(12) United States Patent
Wesneski et al.

(10) Patent No.: US 12,674,973 B2
(45) Date of Patent: Jul. 7, 2026

(54) SYSTEMS AND METHODS TO REDUCE STICTION IN MEMS DEVICES

(71) Applicant: Texas Instruments Incorporated, Dallas, TX (US)

(72) Inventors: Lisa Wesneski, Dallas, TX (US); Toby Linder, Dallas, TX (US); Timothy Patterson, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 955 days.

(21) Appl. No.: 17/746,284

(22) Filed: May 17, 2022

(65) Prior Publication Data

US 2023/0305291 A1     Sep. 28, 2023

Related U.S. Application Data

(60) Provisional application No. 63/322,424, filed on Mar. 22, 2022.

(51) Int. Cl.
*G02B 26/08* (2006.01)
*B81B 3/00* (2006.01)

(52) U.S. Cl.
CPC ........ *G02B 26/0833* (2013.01); *B81B 3/0013* (2013.01); *B81B 2201/042* (2013.01)

(58) Field of Classification Search
CPC .............. G02B 26/0833; B81B 3/0013; B81B 2201/042; B81B 3/001
See application file for complete search history.

(56) References Cited

U.S. PATENT DOCUMENTS

| | | | |
|---|---|---|---|
| 2004/0136044 A1* | 7/2004 | Miller ................ | G02B 26/0841 359/223.1 |
| 2014/0376069 A1* | 12/2014 | Reinmuth .......... | G02B 26/0841 29/825 |
| 2019/0155016 A1* | 5/2019 | Sherwin ............. | G02B 26/0833 |
| 2019/0204586 A1* | 7/2019 | Martinez ........... | G02B 26/0841 |

FOREIGN PATENT DOCUMENTS

| | | | | |
|---|---|---|---|---|
| DE | 19854803 A1 * | 5/2000 | ......... | G02B 26/0866 |

* cited by examiner

*Primary Examiner* — Charles S Chang
(74) *Attorney, Agent, or Firm* — Michael T. Gabrik; Frank D. Cimino

(57) ABSTRACT

Systems and methods to reduce stiction in MEMS devices are disclosed. A microelectromechanical system (MEMS) device includes a substrate; a via supported by the substrate, the via comprising a first metal layer comprising a material; an arm extending away from and supported by the via, the arm comprising the material; and a second metal layer within the via on the first metal layer, wherein the second metal layer comprises nitrogen.

19 Claims, 12 Drawing Sheets

SYSTEMS AND METHODS TO REDUCE STICTION IN MEMS DEVICES

RELATED APPLICATION(S)

This patent claims priority to U.S. Provisional Patent Application No. 63/322,424, which was filed on Mar. 22, 2022, and which is incorporated herein by reference in its entirety.

FIELD OF THE DISCLOSURE

This disclosure relates generally to microelectromechanical systems (MEMS) and, more particularly, to systems and methods to reduce stiction in MEMS devices.

BACKGROUND

Microelectromechanical systems (MEMS) include microscopic devices that often include moving parts controlled through electrical signals. A digital micromirror device (DMD) is a particular example of a MEMS device that includes an array of micromirror assemblies that each include a mirror that can be rotated about a hinge to direct the reflection of light on the mirror surface. An array of such micromirror assemblies may be fabricated on a single chip for implementation in a projector with each micromirror assembly controlling a separate pixel of a projected image.

Figure 1:
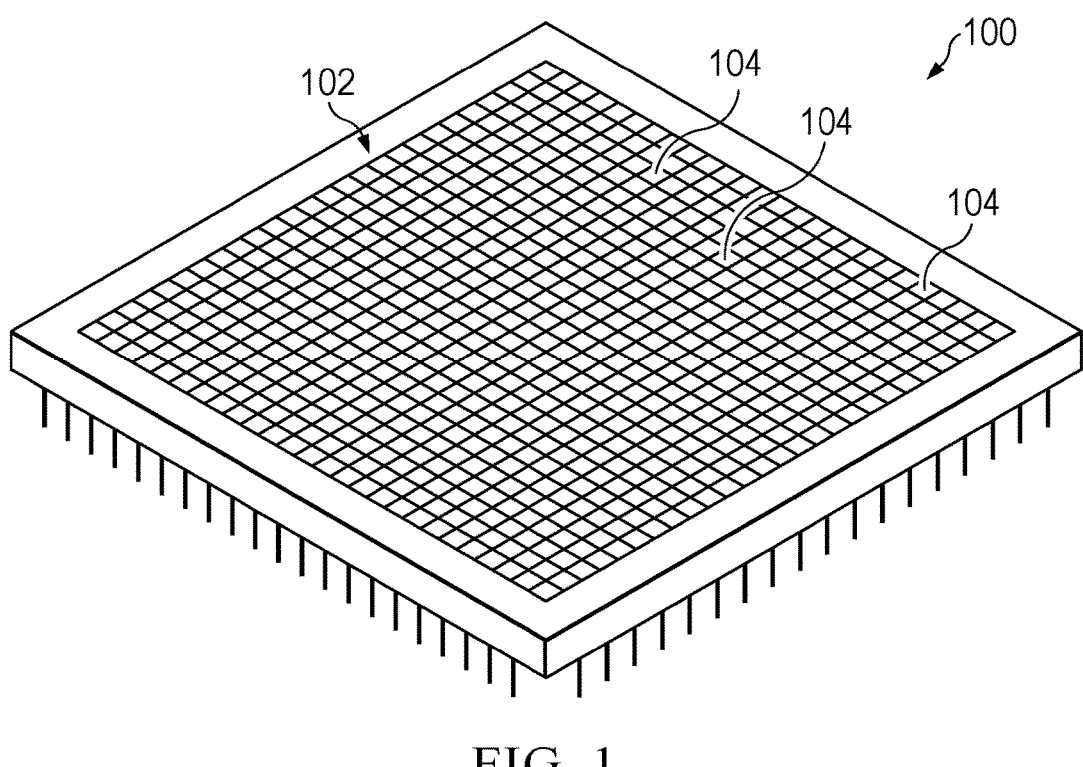
FIG. 1 illustrates an example DMD chip constructed in accordance with teachings disclosed herein.

In general, the same reference numbers will be used throughout the drawing(s) and accompanying written description to refer to the same or like parts. The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of +/−10% unless otherwise specified in the below description. As used herein "substantially real time" refers to occurrence in a near instantaneous manner recognizing there may be real world delays for computing time, transmission, etc. Thus, unless otherwise specified, "substantially real time" refers to real time +/−1 second.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

DETAILED DESCRIPTION

Individual micromirror assemblies of a digital micromirror device (DMD) include a micromirror or mirror plate that is attached to and rotates about a hinge in response to electrical signals provided to electrodes positioned adjacent to the mirror and/or hinge. In some instances, the extent of movement or rotation of a mirror in a micromirror assembly is limited by spring tips that interface or contact an underside of the mirror (e.g., the side opposite the surface that is intended to reflect light). More particularly, springs tips often correspond to structures with cantilevered arms that are capable to flex or bend in a resilient manner (e.g., like a spring) in response to the mirror being urged against the spring tips. Many micromirror assemblies include at least one spring tip to contact the underside of a mirror when the mirror is rotated a full extent in a first direction (about a hinge) and at least one other spring tip to contact the underside of the mirror when the mirror is rotated a full extent in the second direction opposite the first direction.

The contact between a micromirror and one or more spring tips results in stiction or adhesion between the components. Thus, to move or rotate a micromirror away from contacting spring tip(s) requires enough force to overcome the stiction between the mirror and spring tip(s). Furthermore, degradation of components over time can result in an increase in stiction. As a result, the amount of force required to move a mirror (and overcome stiction) can increase over time, thereby leading to degradation of performance and eventually device failure. That is, one factor that contributes to the shortening of the useful life of a DMD is the increase in stiction that occurs over time. Thus, the useful life of a DMD can be improved by at least one of reducing the baseline amount of stiction between components at the time of manufacture (to provide a larger margin that allows for more time for stiction to increase before failure) or increasing the electrical properties of electrodes to enable for greater forces to be applied to a micromirror to enable it to move and overcome any stiction that may be present. Example teachings disclosed herein enable the reduction in stiction between a micromirror and spring tips for improved performance and useful life. Further, as devices become smaller, it can be more difficult to overcome stiction. Thus, example teachings disclosed herein to reduce stiction enable smaller MEMS devices to be manufactured. Further, example teachings disclosed herein improve the electrical properties of components for improved performance and useful life. Further, example teachings disclosed herein provide improved structural properties for vias used in electrodes and as supports for hinges and/or spring tips in micromirror assemblies.

FIG. 1 illustrates an example DMD chip 100 constructed in accordance with teachings disclosed herein. As shown in the illustrated example, the DMD chip 100 includes an array 102 of individual micromirror assemblies 104. Many DMD chips include hundreds of thousands of individual micromirror assemblies 104. However, a fewer number of micromirror assemblies 104 are shown in FIG. 1 for purposes of illustration. Each micromirror assembly 104 includes a micromirror (or simply mirror, for short) that can be rotated about a corresponding hinge via associated control circuitry in the DMD chip 100. Further detail regarding the implementation and construction of each of the micromirror assemblies 104 is provided below in connection with FIGS. 2 and 3.

While examples described below and detailed in the figures correspond to micromirror assemblies of DMDs, teachings disclosed herein are not limited to such applications but can be suitably adapted to any type of MEMS structures, components, or elements and are particular suitable for MEMS devices that include cantilevered metal arms or flanges supported by and extending from a metal via, such as, in contact switches.

Figure 2:
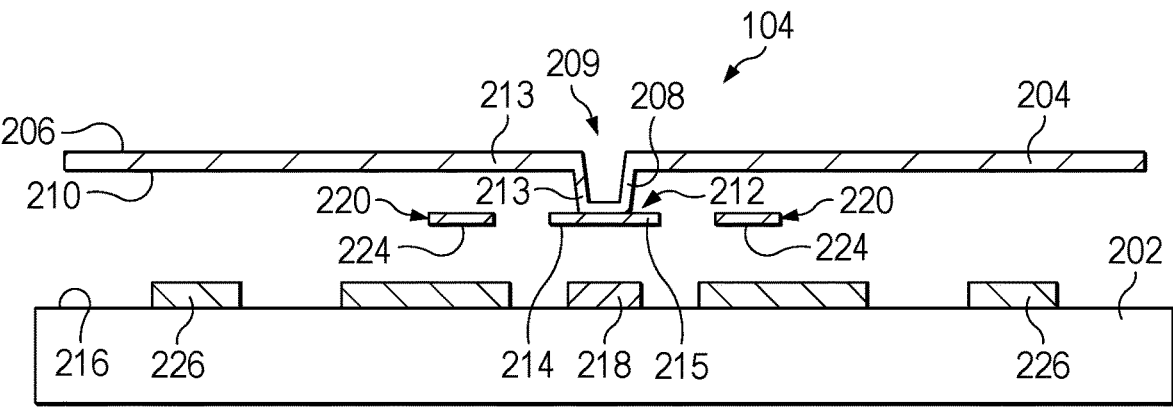
FIG. 2 is a cross-sectional view of an example micromirror assembly of the example DMD chip of FIG. 1 including a metal plate.
Figure 3:
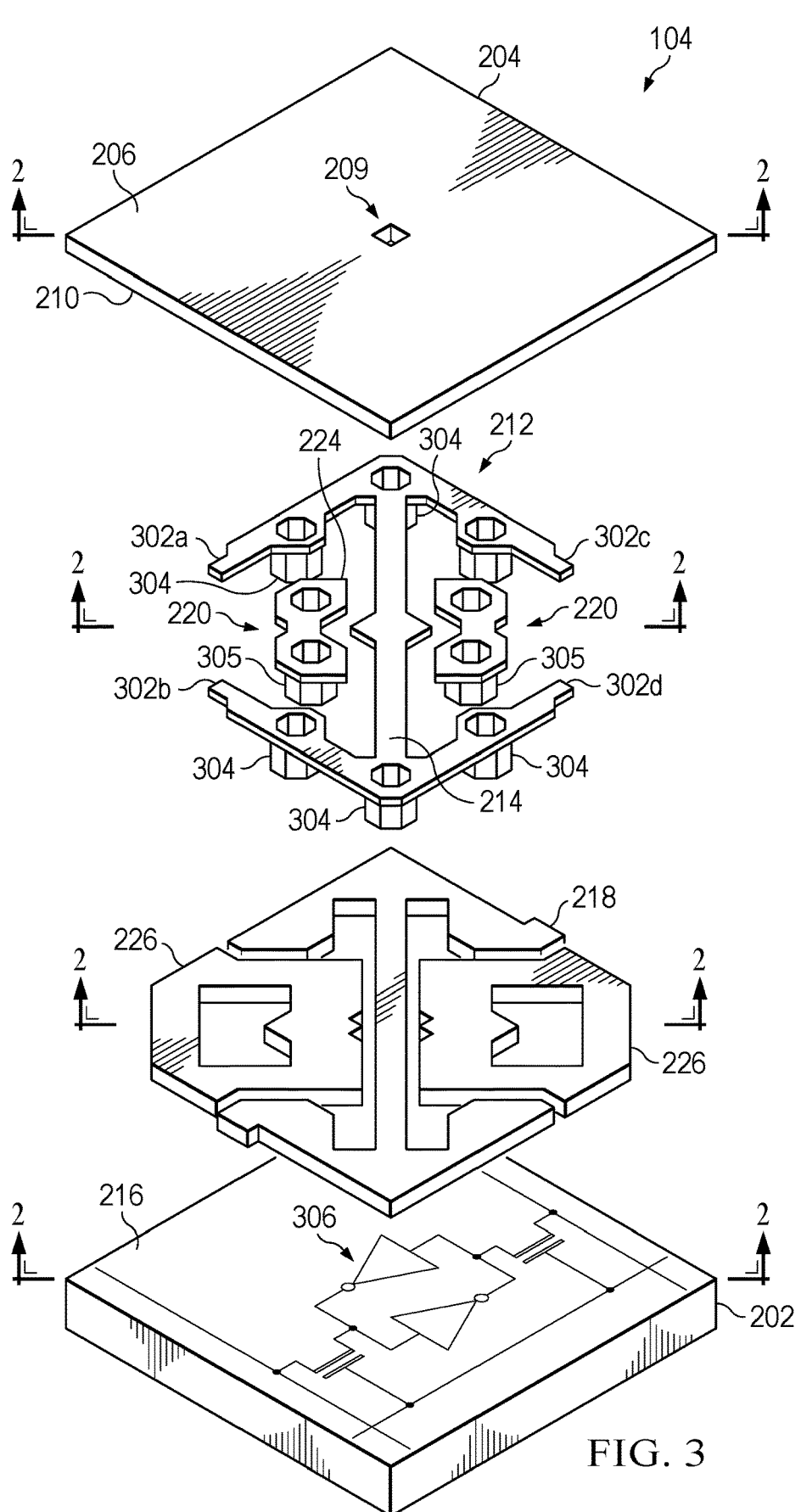
FIG. 3 is an exploded view of the example micromirror assembly of FIG. 2.

FIG. 2 is a cross-sectional view of an example micromirror assembly 104 of the example DMD chip 100 of FIG. 1 taken along the plane defined by the lines 2-2 in FIG. 3, which is an exploded view of the example micromirror assembly of FIG. 2. As shown in the illustrated example, the micromirror assembly 104 is provided on an underlying substrate 202. In some examples, the substrate 202 is a semiconductor (e.g., silicon) substrate. In some examples, all of the micromirror assemblies 104 of the DMD chip 100 of FIG. 1 are fabricated simultaneously on a common substrate (e.g., a single silicon wafer). More particularly, in some examples, multiple DMD chips (each with a corresponding array of micromirror assemblies 104) are fabricated on a common substrate during the same fabrication processes.

As shown in FIGS. 2 and 3, the top of the micromirror assembly 104 (e.g., the point farthest away from the substrate 202) is a plate 204 with an exterior or exposed surface 206 that is reflective to serve as the mirror for the micromirror assembly 104. Accordingly, the plate 204 is alternatively referred to herein as the mirror plate, the micromirror, or simply the mirror of the micromirror assembly 104. In this example, the plate 204 has a generally rectangular or square shape (as shown in FIG. 3) but may be shaped in any other suitable manner (e.g., circular, hexagonal, etc.). In some examples, the plate 204 includes and/or is manufactured from a stack of metal layers. In some examples, a base or primary metal used in the metal stack is aluminum.

In the illustrated example of FIGS. 2 and 3, the plate 204 is suspended in free space with support of a post 208 that protrudes from a back side 210 of the plate 204 (e.g., opposite the exterior or exposed surface 206) near a center of the plate 204. As shown in FIG. 3, the back side 210 is a second exposed surface of the plate 204 that faces in an opposite direction to the exposed surface 206 on the top side of the plate 204. In some examples, the post 208 is coupled to the plate 204 at a location other than the center of the plate 204. In some examples, the plate 204 is supported by more than one post 208. In some examples (as shown), the post 208 is integrally formed with the plate 204. That is, in some examples, the post 208 includes walls defined by metal that protrudes downward from and is a continuous extension of one or more layers in the metal stack of the plate 204. As shown, the formation of the post 208 (not visible in FIG. 3) results in a hole 209 in the exposed surface 206 of the plate 204 that corresponds to the inside of the post 208. In other examples, the hole 209 can be filled with a filler material and/or otherwise covered. For purposes of clarity, the plate 204 and the post 208 are collectively referred to herein as a micromirror structure 213 of the micromirror assembly 104.

In this example, the post 208 is coupled to a hinge assembly 212 that includes a hinge 214 and four spring tips 302a, 302b, 302c, 302d (generically referred to herein by reference number 302). In this example, the hinge 214 and the spring tips 302 are formed of a common layer or plane of metal 215. In some examples, the metal plane 215 is formed of aluminum. In some examples, the metal plane 215 is formed of an aluminum alloy that includes other metals. For instance, in some examples, the metal plane 215 is formed of an alloy of titanium and aluminum (e.g., titanium aluminide ($TiAl_3$). As shown in the illustrated example, the hinge 214 and the spring tips 302 (corresponding to the metal plane 215) are supported spaced apart from a top surface 216 of the substrate 202 by a plurality of pillars or vias 304. In this example, the hinge assembly 212 is supported by a base plate 218 positioned on the underlying substrate 202.

As represented in the illustrated example, the vias 304 have a hollow interior defined by relatively thin walls. The vias 304 are not shown in FIG. 2 because they do not lie within the plane defined by the lines 2-2 shown in FIG. 3. In some examples, the vias 304 are integrally formed with the metal plane 215. That is, in some examples, the vias 304 include walls defined by metal that protrudes downward from and is a continuous extension of the metal plane 215. Further, as described in further detail below, in some examples, the vias 304 include additional metal on an inner surface of the walls and at the inside base of the vias 304. Many known micromirror assemblies include a layer of silicon oxide (e.g., disilicon trioxide ($Si_2O_3$) or other silicon oxide) on the inner surfaces of the pillars or vias. However, in examples disclosed herein, the additional metal is disposed between the base metal (e.g., aluminum or aluminum alloy (e.g., titanium aluminide)) of the via and the silicon oxide. In some examples, this additional metal is different than the metal of the walls of the vias 304 (and the metal of the metal plane 215 integrally formed with the walls of the vias 304). In some examples, the additional metal on the inside of the vias includes multiple layers of different metals. Further detail regarding the additional metals within the vias 304 is provided below in connection with FIG. 6.

The particular design and construction of the hinge assembly 212 shown in FIGS. 2 and 3 is for purposes of illustration only and other designs and constructions are possible. For instance, the metal plane 215 may have a different shape and/or be supported by a different number of vias 304 and/or vias 304 at different positions. Further, in some examples, there may be more than four spring tips 302. In other examples, there may be less than four spring tips 302. Further in some examples, the spring tips 302 are separate from the hinge 214. That is, in some examples, the spring tips 302 are not formed from a common metal plane but completely separate portions of metal that are independently supported by different vias 304. However, in some such examples, the metal for the hinge 214 and the metal for the spring tips 302 are coplanar and correspond to the same layer of material deposited during the same fabrication process.

As shown in FIG. 3, the hinge 214 is relatively thin (corresponding to thickness of the metal plane 215) and extends between two of the vias 304. The elongate length and relatively thin construction of the hinge 214 enables movement of the plate 204 by deflection, twisting, or bending of the hinge 214. More particularly, in the illustrated example, the hinge 214 is to twist or bend so that the plate 204 rotates about an axis extending along a longitudinal length of the hinge 214. In some examples, the hinge 214 twists or bends sufficiently to bring the back side 210 of the plate 204 into contact with either the two spring tips 302*a-b* (on the lefthand side of FIG. 3) or the two spring tips 302*c-d* (on the righthand side of FIG. 3) depending on which way the plate 204 and hinge 214 are moved.

In some examples, movement of the plate 204 (and hinge 214) is controlled by electrical signals (e.g., voltages) provided to one or more electrodes 220 positioned adjacent the hinge assembly 212. In the illustrated example, the electrodes are defined by additional pillars or vias 305 and flanges 224 at an upper end of the vias 305. The vias 305 are not shown in FIG. 2 because they do not lie within the plane defined by the lines 2-2 shown in FIG. 3. In some examples, the vias 305 have a similar height as the vias 304 such that the flanges 224 are at a same height as the hinge 214 and spring tips 302. More particularly, in some examples, the flanges 224 are coplanar with and correspond to the same material in the metal plane 215. As represented in the illustrated example, the vias 305 have a hollow interior defined by relatively thin walls with a same or similar construction as the vias 304 supporting the hinge 214 and spring tips 302. In some examples, the inner surfaces of the walls and at the inside base of the vias 305 include the same additional metal as in the vias 304 associated with the hinge assembly 212.

In the illustrated example of FIGS. 2 and 3, separate electrodes 220 are positioned on either side of the hinge 214 and are supported by separate electrode base plates 226 positioned on the underlying substrate 202. Charges applied to the electrodes 220 either attract or repel the plate 204, the post 208, and/or portions of the hinge assembly 212, thereby enabling the plate 204 to rotate or move due to deflection of the hinge 214. In some examples, charges applied to the electrodes 220 are provided through circuitry 306 provided in the substrate 202 (the circuitry 306 is diagrammatically represented on the top surface 216 of the substrate 202 in FIG. 3 for purposes of explanation). The position and size of the electrodes 220 shown in FIG. 2 is for purposes of illustration only and other designs and/or constructions are possible.

Figure 4:
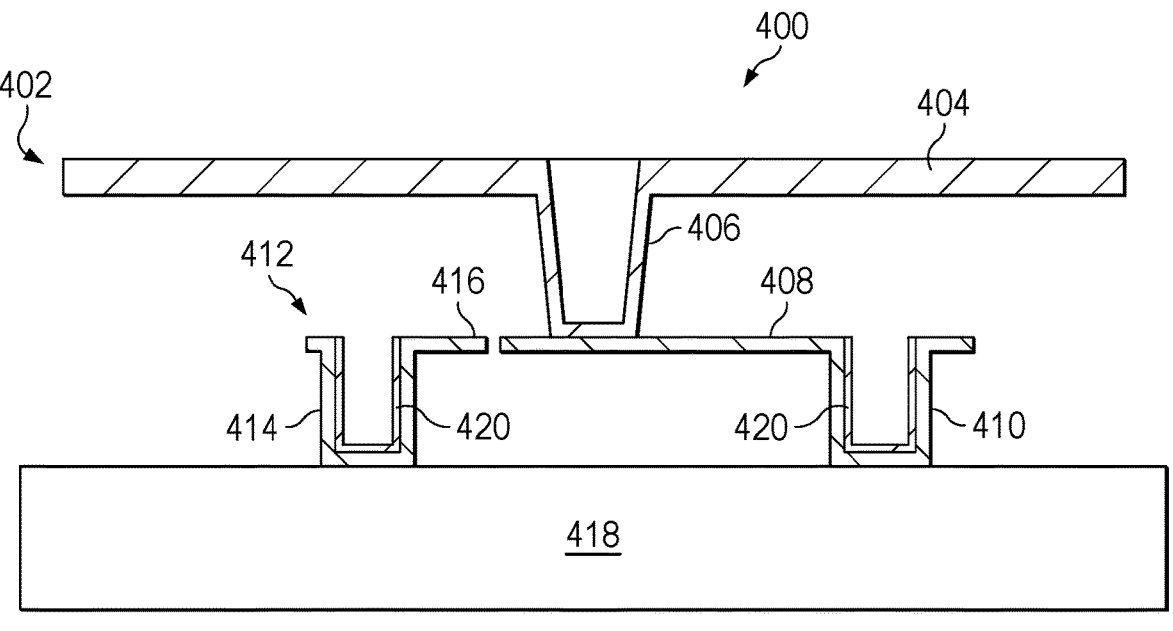
FIG. 4 is a cross-sectional view of another example micromirror assembly.

The particular design of the example micromirror assembly 104 shown in FIGS. 2 and 3 is for purposes of illustration only and many other designs are possible. For instance, FIG. 4 illustrates a cross-sectional view of another example micromirror assembly 400 in which a micromirror structure 402 (including a plate 404 and a post 406) is supported near an end of a cantilevered hinge 408 supported by a pillar or via 410. In such examples, unlike the hinge 214 of FIGS. 2 and 3 that twists between two vias 304 at opposite ends of the hinge 214, the hinge 408 of FIG. 4 deflects up and down at its free end (farthest from the via 410) to cause the plate 404 to rotate about an axis proximate the via and extending into and out of the view shown in FIG. 4. In some examples, the movement of the plate 404 is sufficient to contact spring tips that may be constructed similar to the spring tips 302 shown in FIG. 3. In this example, an electrode 412 is positioned adjacent the free end of the hinge 408. The electrode 412 includes a pillar or via 414 that supports a flange 416. In the illustrated example of FIG. 4, the via 410 and electrode 412 are mounted on the underlying substrate 418 without an intervening base plate (as in FIGS. 2 and 3). In some examples, the micromirror assembly 400 includes spring tips (not shown) positioned to interface with, engage, and/or contact an underside of the plate 404 when the plate 404 is deflected or rotated to one side or the other. In some examples, one or more of the spring tips are an integral extension to the hinge 408 and associated via 410. Additionally or alternatively, in some examples, one or more of the spring tips are an integral extension to the electrode 412. Additionally or alternatively, one or more of the spring tips are distinct and spaced apart from the hinge 408 and electrode 412. As shown in the illustrated example of FIG. 4, both vias 410, 414 include additional metal 420 on the inner surfaces of walls of the vias 410, 414 between the via walls and a layer of silicon oxide. Further detail regarding the additional metal 420 is provided below in connection with FIG. 6.

Figure 5:
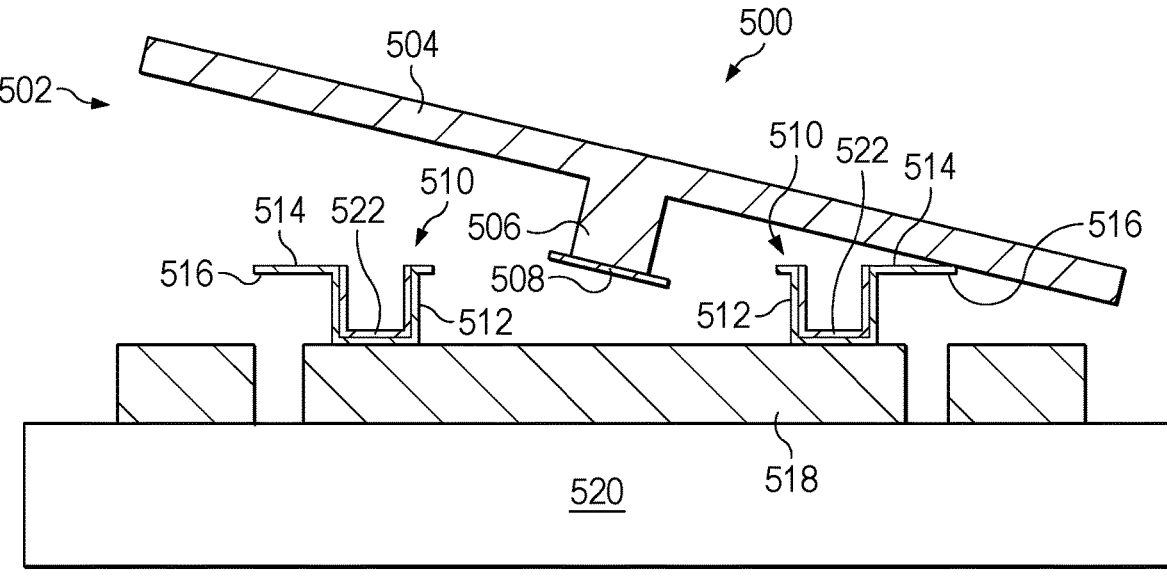
FIG. 5 is a cross-sectional view of another example micromirror assembly.

FIG. 5 illustrates a cross-sectional view of another example micromirror assembly 500 in which a micromirror structure 502 (including a plate 504 and a post 506) is positioned on a hinge 508 that extends into and out of the drawing between separate pillars or vias (not shown) in a manner similar to that shown in FIGS. 2 and 3. In the illustrated example of FIG. 5, the hinge 508 is shown deflected to one side resulting in the plate 504 tilting or rotating accordingly. Similar to FIGS. 2 and 3, the micromirror assembly 500 of FIG. 5 includes electrodes 510 (defined by pillars or vias 512 and corresponding flanges 514) positioned on either side of the hinge 508. However, unlike the example shown in FIGS. 2 and 3, the electrodes 510 in FIG. 5 are spaced farther away from hinge 508 with a longer protruding portion of the flanges 514 on the side of the electrodes 510 opposite the hinge 508. In some examples, the longer protruding portion of the flanges 514 correspond to spring tips 516 that interface with or contact the underside of the plate 504 when the micromirror structure 502 is rotated as shown in FIG. 5. As shown in the illustrated example of FIG. 5, the vias 512 include additional metal 522 on the inner surfaces of walls and at the inside base of the vias 512 between the via walls and a layer of silicon oxide. Further detail regarding the additional metal 522 is provided below in connection with FIG. 6.

The micromirror assembly 500 of FIG. 5 further differs from FIGS. 2 and 3 in that both electrodes 510 are supported by a common portion of a base plate 518 (on an underlying substrate 520) rather than separate portions as in FIGS. 2 and 3.

More generally speaking, the design, shape, and/or structure of any of the micromirror assemblies 104, 400, 500 of FIGS. 1-5 can be modified in any suitable manner in accordance with teachings disclosed herein. For instance, the hinges can be sized and shaped in any suitable manner and located in any suitable manner to enable adjustments to the orientation of the mirror. In some examples, more than one hinge may be implemented to enable adjustments to the orientation of the mirror in multiple directions. In some such examples, different hinges and associated supporting vias may be positioned at different levels in an associated hinge assembly (e.g., a first hinge can be supported by a first via that is itself mounted to a second hinge supported by a second via). Further, the electrodes can be sized and shaped in any suitable manner and located at any suitable position relative to the micromirror structure and supporting hinge assembly. Additionally, the spring tips can be sized and shaped in any suitable manner and located at any suitable position to interface with and/or contact the underside of the mirrors when rotated toward the corresponding spring tip(s).

As mentioned above, the operation of any of the example micromirror assemblies 104, 400, 500 of FIGS. 1-5 involve the application of voltages to the electrode(s) to induce movement or rotation of the micromirror structures 213, 402, 502 until the underside of the associated plate 204, 404, 504 is urged against or comes into contact with one or more spring tips (e.g., the spring tips 302, 516). When the micromirror structure 213, 402, 502 is to move again, different voltages (e.g., having a reversed polarity) are applied to the electrodes to return the mirror structure to a neutral position (spaced apart from the spring tips) or to move the micromirror structure 213, 402, 502 in a different direction to contact different ones of the spring tips. The contact between the underside of the micromirror structure 213, 402, 502 and interfacing spring tips results in stiction. As a result, there is a threshold amount of force needed to overcome the stiction to cause the micromirror structure 213, 402, 502 to move away from a contacting spring tip. Examples disclosed herein reduce stiction relative to existing micromirror assemblies, thereby improving the performance of such MEMS devices and increasing their useful life (because there is greater margins over which the devices can degrade before failure).

Figure 6:
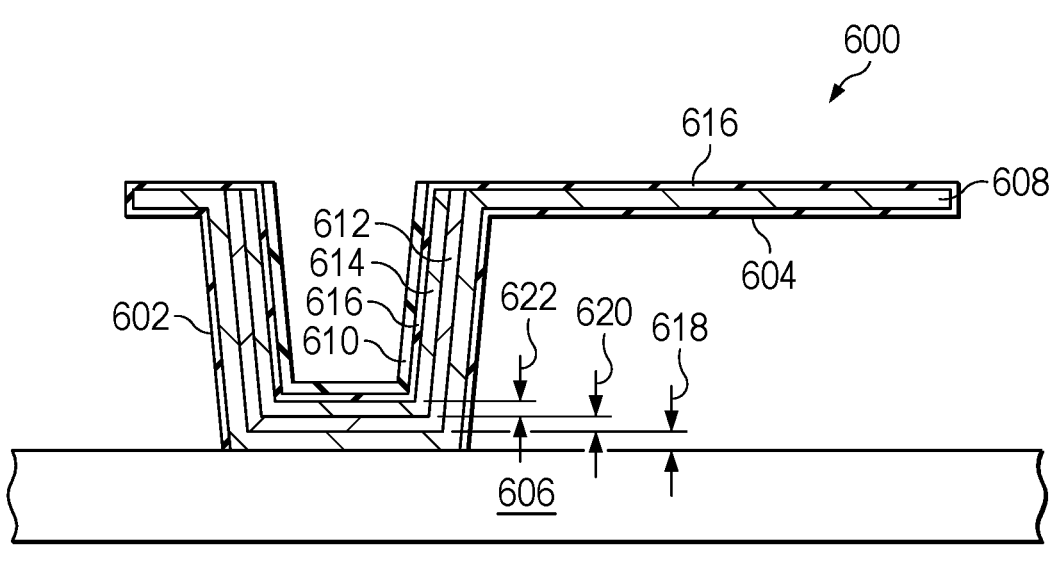
FIG. 6 is an enlarged view of an example MEMS structure including a pillar or via supporting a flange or arm extending therefrom that may be implemented in any one of the example micromirror assemblies of FIGS. 1-5.

More particularly, experimental testing has shown that the inclusion of the additional metal (e.g., the additional metal 420, 522 in FIGS. 4 and 5) reduces stiction. The additional metal also provides other advantages detailed further below. FIG. 6 is an enlarged view of an example MEMS structure 600 including a pillar or via 602 supporting a flange or arm 604 extending therefrom that may be implemented in any one of the example micromirror assemblies 104, 400, 500 of FIGS. 1-5. That is, the example pillar or via 602 may correspond to any one of the vias 305, 304, 410, 414, 512 of FIGS. 2-5. Further, the arm 604 in FIG. 6 may correspond to any one of the flanges 224, 416, 514, the hinges 214, 408, 508, and/or the spring tips 302, 516 of FIGS. 2-5. Although examples disclosed herein are described with reference to a micromirror assembly implemented in a DMD chip (e.g., the DMD chip 100 of FIG. 1), teachings disclosed herein can be implemented to reduce stiction and improve physical and/or electrical properties of pillars or vias supporting any type of flanges, arms, or other portion of a sheet or plane of metal extending from the pillars or vias used in any type of MEMS device.

In the illustrated example of FIG. 6, the via 602 is integrally formed with the arm 604. That is, in some examples, the vertically oriented walls of the via 602 and the horizontally extending flange corresponding to the arm 604 are continuous extensions of one another and correspond to a base metal layer 608 (also referred to herein as a first metal layer 608) of the MEMS structure 600. Thus, in such examples, the via 602 and the arm 604 are composed of the same material. In some examples, the via 602 and/or the arm 604 are composed of a material including aluminum and titanium (e.g., titanium aluminide (TiAl$_3$)). As shown in the illustrated example of FIG. 6, the via 602 is mounted to an underlying substrate 606, which can correspond to any one of the substrates 202, 418, 520 and/or base plates 218, 226, 518 of FIGS. 1-5.

The example MEMS structure 600 of FIG. 6 includes a layer of silicon oxide 610 on the inside of the via 602. The silicon oxide 610 is separated from the metal walls of the via 602 by one or more additional layers of metal. In this example, there are two additional layers of metal (a second metal layer 612 and a third metal layer 614) positioned inside the via 602 between the walls of the via 602 and the silicon dioxide. In other examples, there is only one layer of metal between the via 602 and the silicon oxide 610. In other examples, there is at least three layers of metal between the via 602 and the silicon oxide 610. In some examples, the second and third metal layers 612, 614 are composed of intermetallic compounds that are different than the material used for the via 602 and the arm 604. In some examples, at least one of the second and third metal layers 612, 614 includes a nonmetallic element (e.g., nitrogen). In this example, the second metal layer 612 immediately adjacent the via 602 includes titanium and nitrogen (e.g., titanium nitride (TiN)) and the third metal layer 614 includes aluminum, titanium, and silicon (e.g., AlTiSi). In other examples, different materials are used in one or both of the second and third metal layers 612, 614.

In some examples, a native oxide 616 is provided on the outer surfaces of the first metal layer 608 defining the via 602 and the arm 604, and on the outer surfaces of the third (innermost) metal layer 614 within the via 602. Thus, as shown in the illustrated example of FIG. 6, the native oxide 616 is positioned between the third (innermost) metal layer 614 within the via 602 and the silicon oxide 610. However, as shown in the illustrated example, there is no native oxide 616 between the walls (or base) of the via 602 (e.g., the first metal layer 608) and the second and third metal layers 612, 614 within the via 602. That is, in some examples, there is little to no native oxide directly against an inner surface of the via 602. In some examples, the location of the native oxide 616 is a function of the order of operations involved in the fabrication of the example MEMS structure 600. As discussed further below in connection with FIGS. 7-20, in some examples, the second and third metal layers 612, 614 are deposited in-situ following the formation (e.g., deposition) of the first metal layer 608 corresponding to the via 602 and the arm 604. As a result, the second and third metal layers 612, 614 are provided before the MEMS structure 600 is exposed to air to form the native oxide 616. However, after the second and third metal layers 612, 614 are added, the MEMS device is exposed to air as it undergoes additional processing before the silicon oxide 610 is added, thereby resulting in the formation of the native oxide 616. More particularly, in some examples, when the second and third metal layers 612, 614 are added, the cover the entire upper facing (exposed) surface of the first metal layer 608. That is, the second and third metal layers 612, 614 extend across the upper surface of the arm 604. However, one or more etching processes are implemented to remove the second and third metal layers 612, 614 from the arm 604. Following such etching process(es), the native oxide 616 may form on the exposed surfaces after which the silicon oxide 610 is added. Further detail regarding the fabrication of micromirror assembly containing the MEMS structure 600 of FIG. 6 is provided below in connection with FIGS. 7-20.

The dimension and/or thickness of the different materials shown in FIG. 6 are for purposes of illustration and not necessarily representative of the actual thickness of the layers in actual implementation. For instance, in some examples, the first metal layer 608 has a thickness 618 that is thicker than a thickness 620 of the second metal layer 612 and thicker than a thickness 622 of the third metal layer 614. In some examples, the thickness 618 of the first metal layer 608 is thicker than the thicknesses 620, 622 of both the second and third metal layers 612, 614 combined. Further, in some examples, the thickness 620 of the second metal layer 612 is thinner than the thickness 622 of the third metal layer 614. In other examples, the thickness 620 of the second metal layer 612 is thicker than the thickness 622 of the third metal layer 614. In other examples, the thicknesses 620, 622 of the second and third metal layers 612, 614 are approximately the same. In some examples, the thickness 618 of the first metal layer 608 is between approximately 150 Å and 500 Å (e.g., 150Å, 200Å, 250 Å, 300Å, 350 Å, 400Å, 450 Å, 500 Å, etc.). In some examples, the thickness 618 of the first metal layer 608 is between approximately 200 Å and 300 Å. In some examples, the thickness 618 of the first metal layer 608 is between approximately 250 Å and 275 Å. In some examples, the thickness 620 of the second metal layer 612 is between approximately 25 Å and 100 Å (e.g., 25Å, 50 Å, 75Å, 100 Å, etc.). In other examples, the thickness 620 of the second metal layer 612 is less than 25 Å or more than 100 Å. In some examples, the thickness 622 of the third metal layer 614 is between approximately 50 Å and 150 Å (e.g., 50Å, 75Å, 100Å, 125Å, 150Å, etc.). In other examples, the thickness 622 of the third metal layer 614 is less than 50 Å or more than 150 Å.

Experimental testing has shown that the addition of the second and third metal layers 612, 614 within the via 602 (which includes the addition and subsequent removal of the second and third metal layers 612, 614 from other exposed surfaces of the first metal layer 608) reduces the amount of stiction between the arm 604 and the underside of a micromirror structure (e.g., any of the micromirror structures 213, 402, 502). More particularly, the amount of stiction can be measured by measuring the minimum voltage needed to flip or move a micromirror from one extreme position (contacting a first spring tip) to an opposite extreme position (contacting a second spring tip positioned on the other side of the mirror). Experimental testing has shown that the average minimum voltage to move a mirror in this manner reduces from approximately 7.5V for an assembly that does not include the additional metal within the vias as disclosed herein down to approximately 4.5V when teachings disclosed herein are implemented. This is a significant (e.g., approximately 40%) improvement to the stiction which provides a much greater margin to allow the stiction to degrade with time while maintaining performance before an associated MEMS device is no longer able to operate properly. Thus, an advantage of teachings disclosed herein is an increase to the useful life of MEMS devices.

Significantly, implementation of teachings disclosed herein does not affect the size, shape, design and/or structure of the first metal (e.g., the first metal layer 608) for the via 602 and the arm 604 such that teachings disclosed herein do not impact the performance or operation of the components in a micromirror assembly. As such, teachings disclosed herein can be incorporated into existing designs for micromirror assemblies without the need or cost of redesigning the base structure.

Another advantage of teachings disclosed herein is improved structural and electrical properties of the vias. As micromirror assemblies continue to get smaller and smaller, the thickness of the first metal layer 608 used to provide the via 602 and the arm 604 gets thinner and thinner. In some situations, the thickness of the first metal layer 608 may be insufficient to provide continuous sidewalls for the via 602. Gaps, holes, and/or discontinuities in the walls of the via 602 negatively impacts the structural integrity of the via 602. Furthermore, such gaps, holes, and/or discontinuities can have a negative impact on the electrical conductivity of the via 602. Indeed, even when there are no gaps, holes, and/or discontinuities, as the walls of the via 602 get thinner, the electrical resistivity of the via 602 increases. Including the second and third metal layers 612, 614 adjacent the walls of the via 602, as shown in FIG. 6, increases the thickness of the overall structure along the walls of the via for improved structural integrity and robustness and reduction in the possibility of gaps, holes, and/or discontinuities in the sidewalls. Furthermore, the additional metal (e.g., the second and third metal layers 612, 614) reduces the resistivity of the via. More particularly, experimental testing has shown a reduction in resistance of over 75% when vias are lined with additional metal layers as disclosed herein as compared with vias that do not include the additional metal layers.

Figure 7:
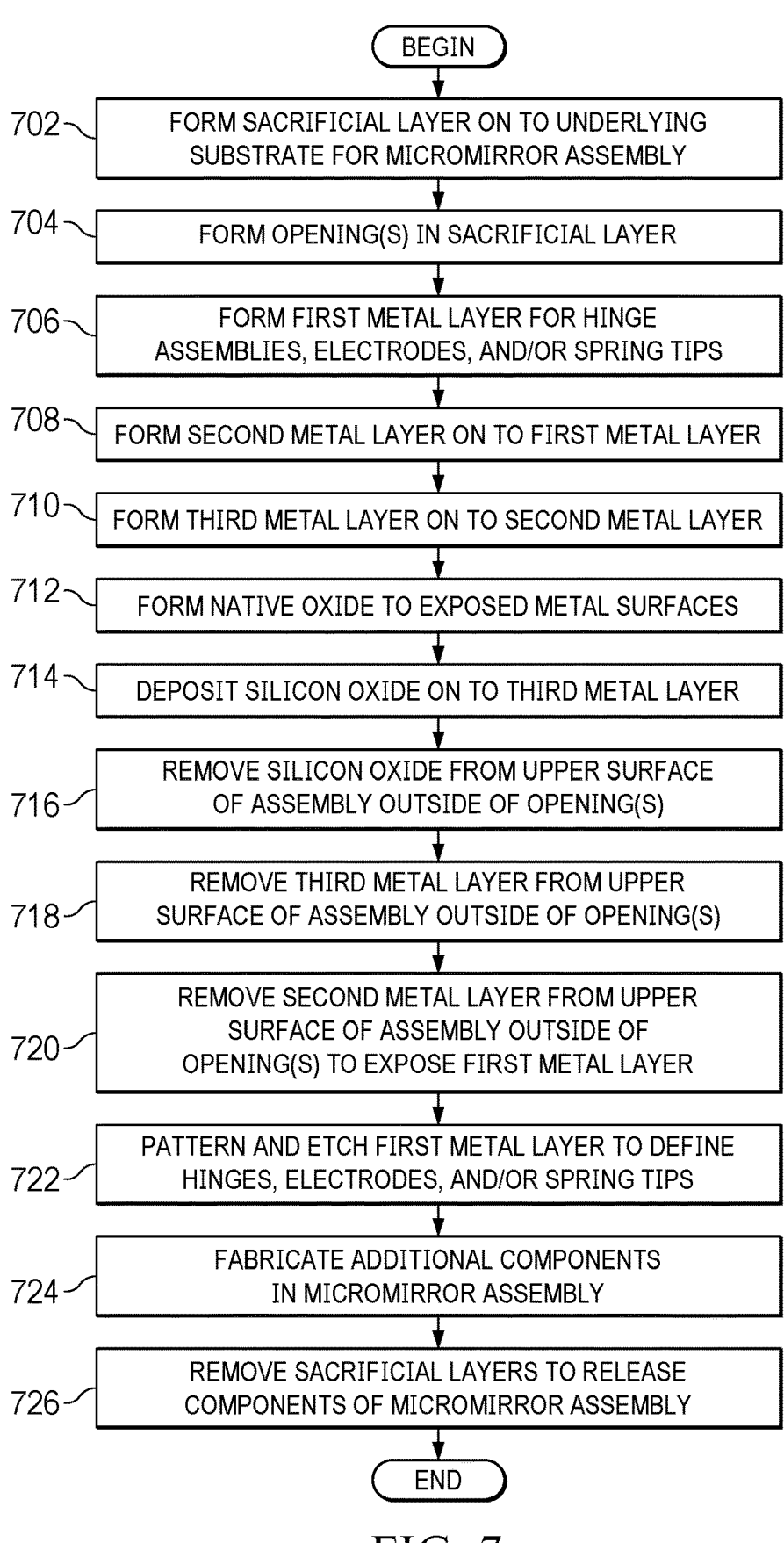
FIG. 7 is a flowchart illustrating an example method of manufacturing a micromirror assembly in accordance with teachings disclosed herein.

FIG. 7 is a flowchart illustrating an example method of manufacturing the example MEMS structure 600 of FIG. 6 in conjunction with the manufacture of any one of the micromirror assemblies 104, 400, 500 of FIGS. 1-5. The example method of manufacture detailed in FIG. 7 is described with reference to FIGS. 8-20, which illustrate the example MEMS structure 600 (and associated micromirror assembly 104, 400, 500) at various stages during the fabrication process outlined in the flowchart of FIG. 7. Although the example method of manufacture is described with reference to the flowchart illustrated in FIG. 7 in conjunction with the example stages of fabrication represented in FIGS. 8-20, many other methods may alternatively be used. For example, the order of execution of the blocks may be changed, and/or some of the blocks described may be combined, divided, re-arranged, omitted, eliminated, and/or implemented in any other way. Further, additional operations not specifically represented by the blocks in FIG. 7 may be included when implementing the example method.

Figure 8:
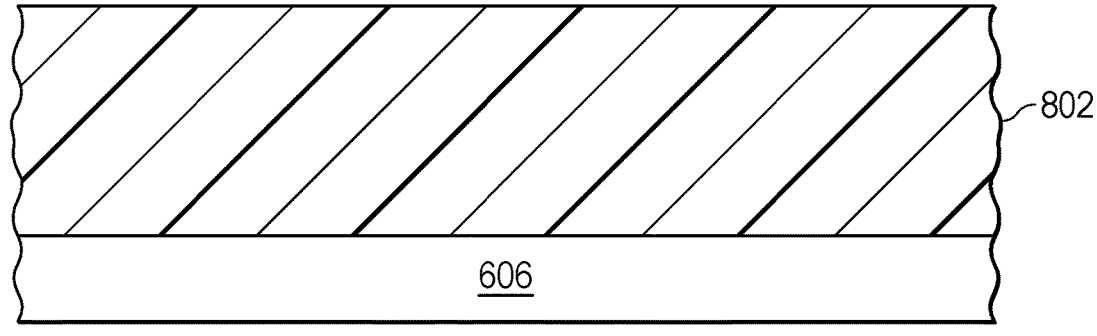
FIGS. 8-20 illustrate different stages of fabrication of the example micromirror assembly described in connection with the example method of manufacture set forth in FIG. 7.

The example process of FIG. 7 begins at block 702 by forming a sacrificial layer 802 (also referred to herein as a spacer) on an underlying substrate 606 for a micromirror assembly. This stage of fabrication is represented in FIG. 8. The formation of the sacrificial layer 802 may be accomplished through any suitable process (e.g., atomic-layer deposition (ALD), chemical vapor deposition (CVD), physical vapor deposition (PVD), spin coating, etc.). In some examples, the thickness of the sacrificial layer 802 corresponds to height of the via 602 to be subsequently formed. As noted above, the underlying substrate of FIG. 6 (shown in FIG. 8) corresponds to a base plate (such as the base plates 218, 226, 518 of FIGS. 2, 3, and/or 5. In other examples the underlying substrate 606 corresponds to a semiconductor substrate (such as the substrates 202, 418, 520 of FIGS. 2-5). The underlying substrate 606 for the micromirror assembly can be fabricated using any suitable processes now known or developed in the future.

Figure 9:
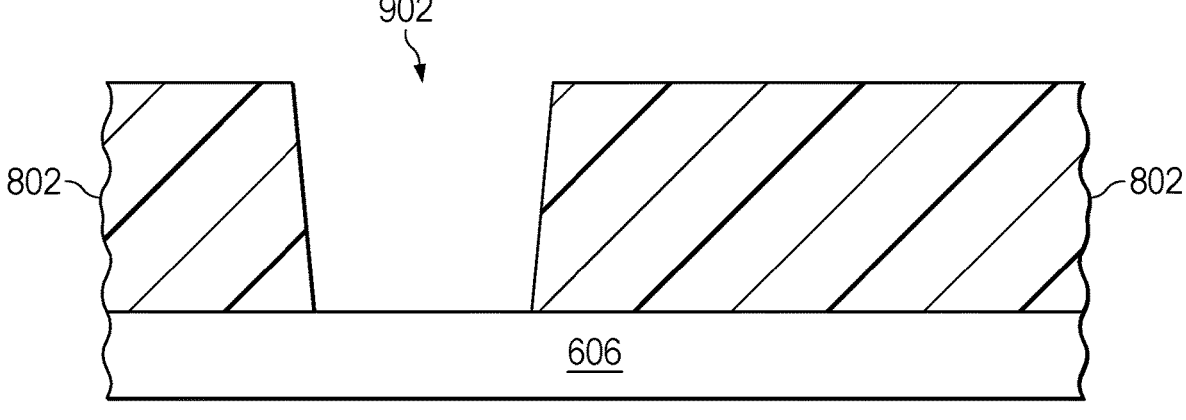

The stage of fabrication corresponding to block 704 of FIG. 7 is represented in FIG. 9. Specifically, at block 704, the method includes forming opening(s) 902 in the sacrificial layer 802. The opening(s) 902 may be formed using any suitable process (e.g., drilling, etching, photolithography. etc.). In some examples, the opening(s) 902 correspond to locations where the pillars or vias associated with the hinges, spring tips, and/or electrodes for the micromirror assembly are to be positioned. Additionally or alternatively, the opening(s) 902 can correspond to the locations of pillars for vias to support any other type of metal flanges or arms used in other types of MEMS devices.

Figure 10:
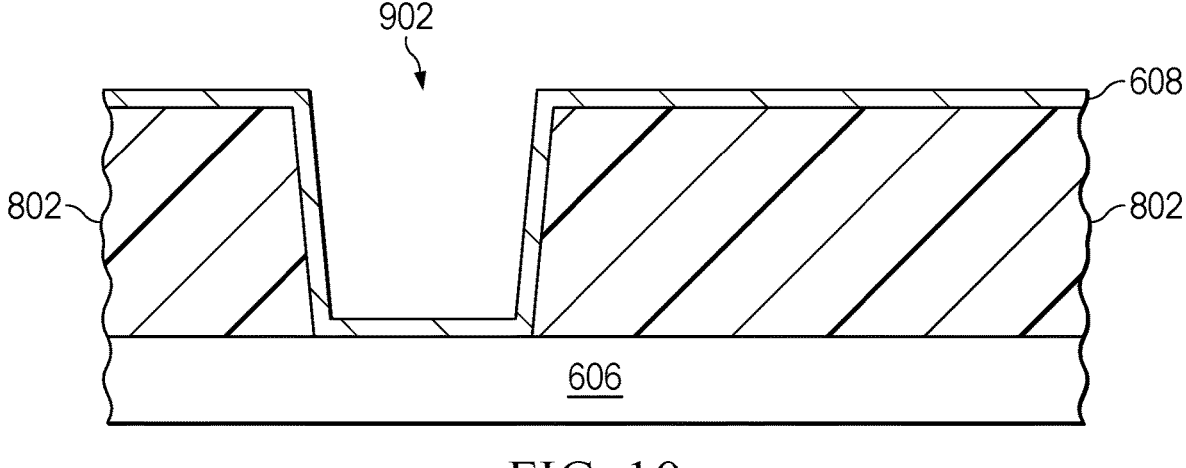

The stage of fabrication corresponding to block 706 of FIG. 7 is represented in FIG. 10. Specifically, at block 706, the method includes forming the first metal layer 608 for hinge assemblies, electrodes, and/or spring tips. Additionally or alternatively, the first metal layer 608 can be used other type of metal flanges or arms extending from associated vias used in other types of MEMS devices. The formation of the first metal layer 608 may be accomplished through any suitable process (e.g., atomic-layer deposition (ALD), chemical vapor deposition (CVD), physical vapor deposition (PVD), electroplating, etc.). As shown in the illustrated example of FIG. 10, the first metal layer 608 covers the exposed upper surface of the sacrificial layer 802 and also covers the wall of the openings 902 in the sacrificial layer 802 that is to define the walls for a via.

Figure 11:
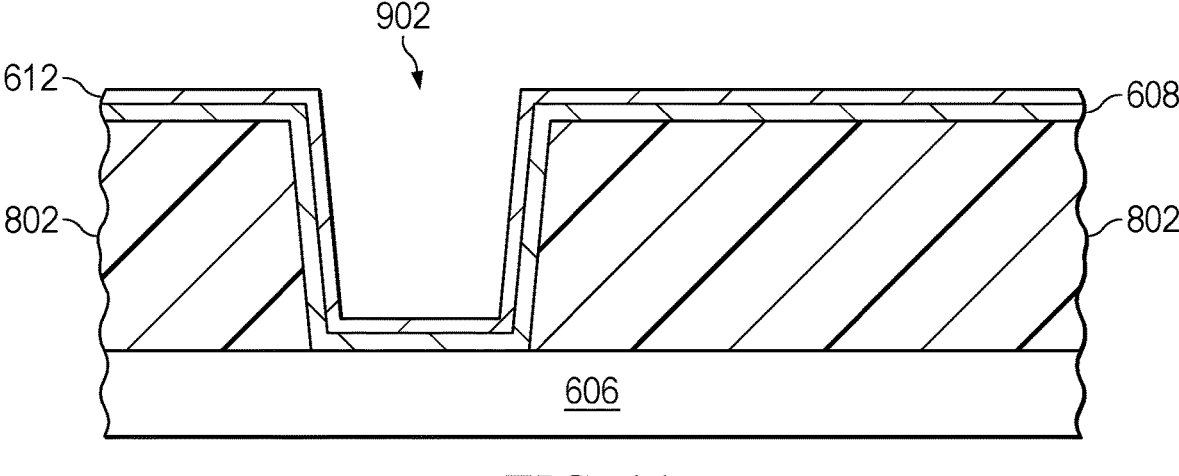

The stage of fabrication corresponding to block 708 of FIG. 7 is represented in FIG. 11. Specifically, at block 708, the method includes forming the second metal layer 612 on the first metal layer 608. The formation of the second metal layer 612 may be accomplished through any suitable process (e.g., atomic-layer deposition (ALD), chemical vapor deposition (CVD), physical vapor deposition (PVD), electroplating, etc.). As shown in the illustrated example of FIG. 11, the second metal layer 612 covers all exposed surfaces of the underlying first metal layer 608 including along the upper surface as well as within the opening 902.

Figures 12, 13:
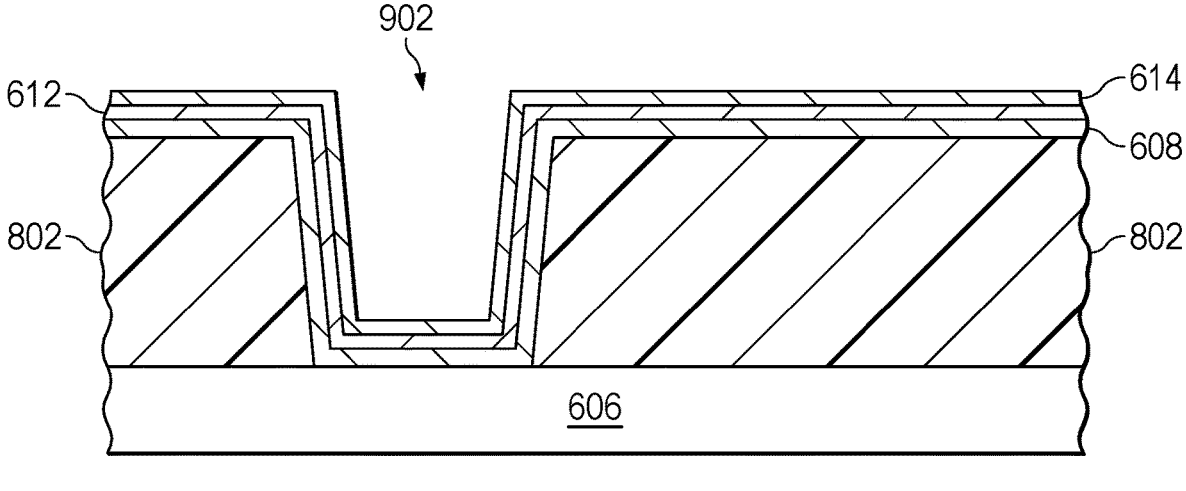

The stage of fabrication corresponding to block 710 of FIG. 7 is represented in FIG. 12. Specifically, at block 710, the method includes forming the third metal layer 614 on the second metal layer 612. The formation of the third metal layer 614 may be accomplished through any suitable process (e.g., atomic-layer deposition (ALD), chemical vapor deposition (CVD), physical vapor deposition (PVD), electroplating, etc.). As shown in the illustrated example of FIG. 12, the third metal layer 614 covers all exposed surfaces of the underlying second metal layer 612 including along the upper surface as well as within the opening 902.

The stage of fabrication corresponding to block 712 of FIG. 7 is represented in FIG. 13. Specifically, at block 712, the method includes forming the native oxide 616 on exposed metal surfaces. At this stage of fabrication, the exposed metal surfaces corresponds to the exposed surfaces of the third metal layer 614. In some examples, the formation of the native oxide 616 is accomplished naturally by exposing the assembly to air in the ambient environment. In some examples, this happens automatically as a result of changing between fabrication processes. In some examples, little to no native oxide is formed directly on the first metal layer 608 or the second metal layer 612 because all three metal layers 608, 612, 614 are added in-situ without the assembly being exposed to air in the ambient environment.

Figures 14, 15:
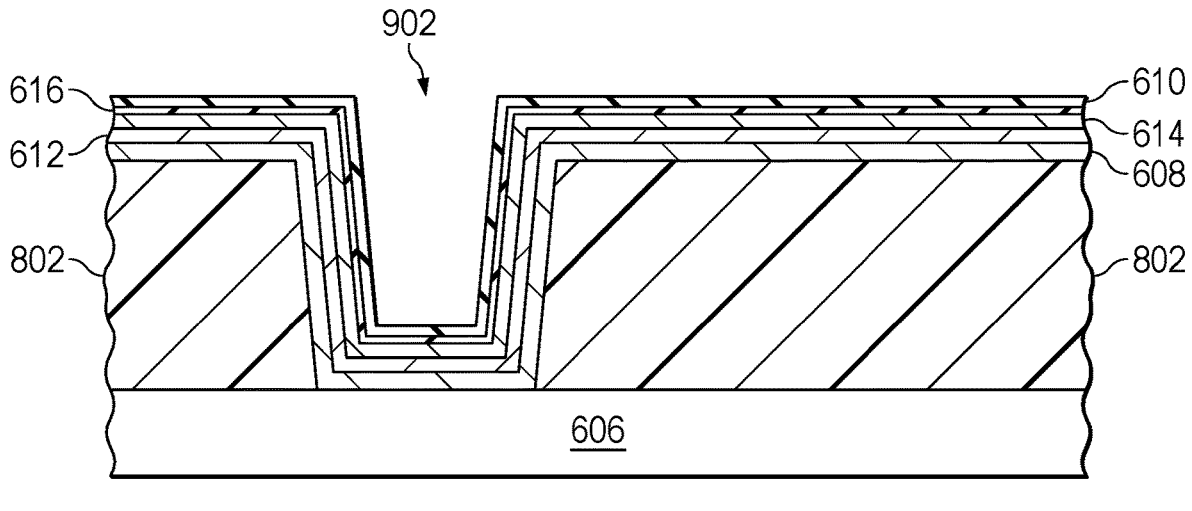

The stage of fabrication corresponding to block 714 of FIG. 7 is represented in FIG. 14. Specifically, at block 714, the method includes depositing the silicon oxide 610 on to the third metal layer 614 (including the native oxide 616 formed thereon). The deposition of the silicon oxide 610 may be accomplished through any suitable process (e.g., atomic-layer deposition (ALD), chemical vapor deposition (CVD), physical vapor deposition (PVD), electroplating, etc.). As shown in the illustrated example of FIG. 13, the silicon oxide 610 covers all exposed surfaces of the underlying third metal layer 614 including along the upper surface as well as within the opening 902. Further, as shown, the native oxide 616 is positioned between the silicon oxide 610 and the underlying third metal layer 614. In some examples, a bottom anti-reflective coating (BARC) layer is added before the deposition of the silicon oxide 610 to facilitate subsequent removal of portions of the silicon oxide 610 as described further below.

The stage of fabrication corresponding to block 716 of FIG. 7 is represented in FIG. 15. Specifically, at block 716, the method includes removing the silicon oxide 610 from the upper surface of the assembly outside of the opening 902. That is, the native oxide 616 is retained within the opening 902 but otherwise removed from the surface of the underlying third metal layer 614 (and associated native oxide 616). In some examples, the removal of the silicon oxide 610 is accomplished through any suitable process (e.g., dry etch, wet etch, etc.).

Figures 16, 17:
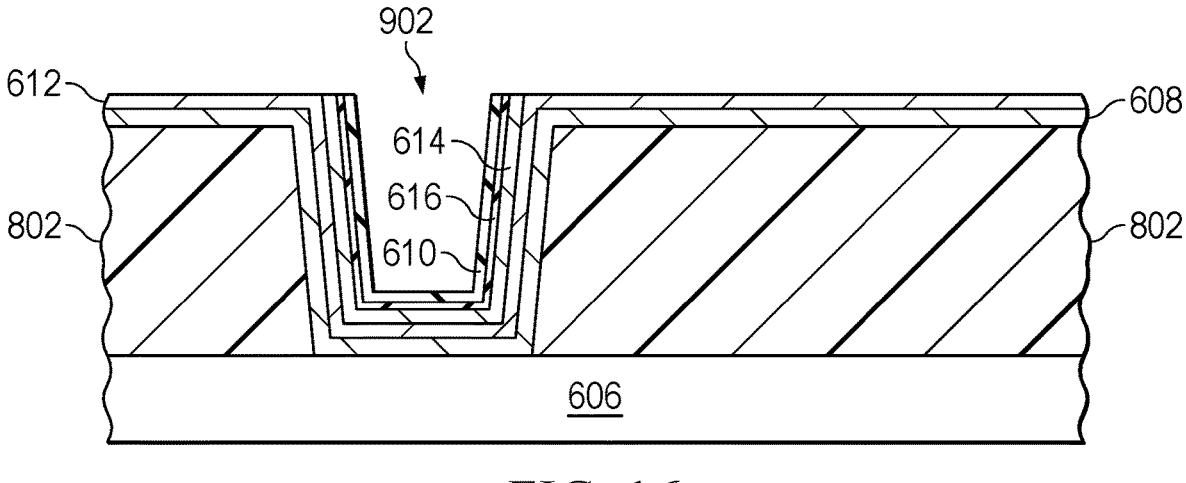

The stage of fabrication corresponding to block 718 of FIG. 7 is represented in FIG. 16. Specifically, at block 718, the method includes removing the third metal layer 614 from the upper surface of the assembly outside of the opening 902. That is, exposed portions of the third metal layer 614 (uncovered by the removal of the silicon oxide 610 at block 716) is removed while the portions within the opening 902 (that remained covered by the silicon oxide 610) is retained. In some examples, the removal of the third metal layer 614 is accomplished through any suitable process (e.g., dry etch, wet etch, etc.). Further, in some examples, the exposed portions of the native oxide 616 previously formed on the third metal layer 614 are removed in the same process as the removal of the third metal layer 614. In some examples, the uppermost portion of the silicon dioxide 610 is removed during this process so that the upper surface of the assembly remains approximately level (e.g., the silicon oxide 610 does not protrude above the now exposed upper surface of the second metal layer 612). In some examples, this uppermost portion of the silicon oxide 610 is removed during the stage of fabrication associated with block 716.

The stage of fabrication corresponding to block 720 of FIG. 7 is represented in FIG. 17. Specifically, at block 720, the method includes removing the second metal layer 612 from the upper surface of the assembly outside of the opening 902. That is, exposed portions of the second metal layer 612 (uncovered by the removal of the third metal layer 614 at block 718) is removed while the portions within the opening 902 (that remained covered by the silicon oxide 610 and the third metal layer 614) is retained. In some examples, the removal of the third metal layer 614 is accomplished through any suitable process (e.g., dry etch, wet etch, etc.). In some examples, the uppermost portions of the silicon oxide 610 and the third metal layer 614 are removed during this process so that the upper surface of the assembly remains approximately level (e.g., the silicon oxide 610 and the third metal layer 614 do not protrude above the now exposed upper surface of the first metal layer 608). In some examples, the uppermost portions of the silicon oxide 610 and the third metal layer 614 are removed during the stages of fabrication associated with block 716 and/or 718.

Figure 18:
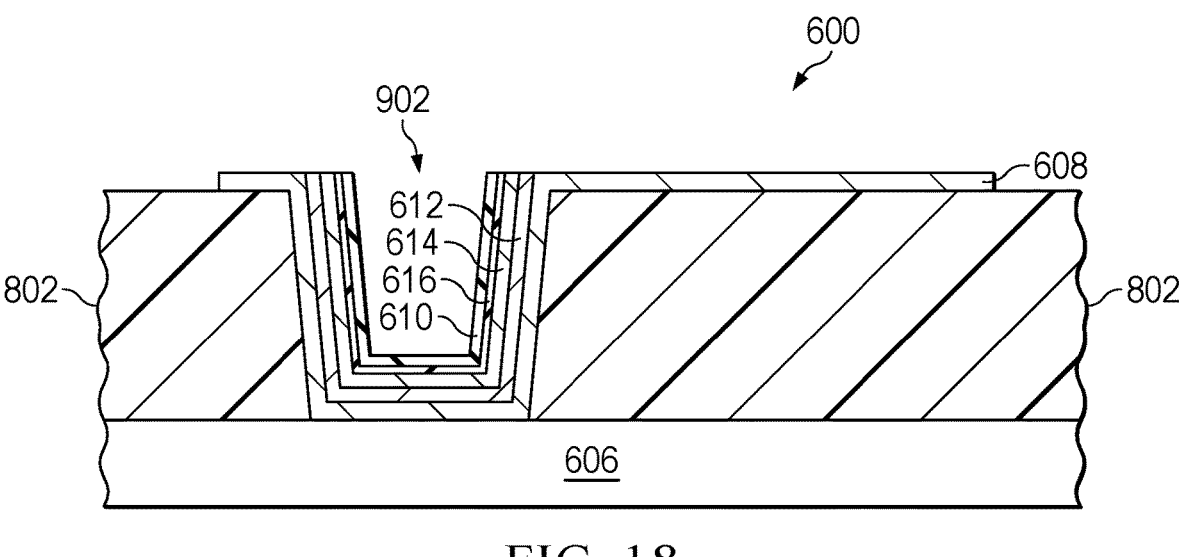

The stage of fabrication corresponding to block 722 of FIG. 7 is represented in FIG. 18. Specifically, at block 722, the method includes patterning and etching the first (base) metal layer 608 (uncovered by the removal of the second metal layer 612 at block 720) to define hinges, electrodes, and/or spring tips. That is, up until the stage of fabrication presented in FIG. 18, the first metal layer is a continuous sheet or plane of metal extending across the upper surface of the underlying sacrificial layer 802. However, the process of patterning the first metal layer 608 at block 722 divides the continuous sheet into different segments or portions corresponding to the intended design of the micromirror assembly (or any other type of MEMS device) being manufactured. The patterning and etching may be accomplished through any suitable process (e.g., lithographic techniques).

Figure 19:
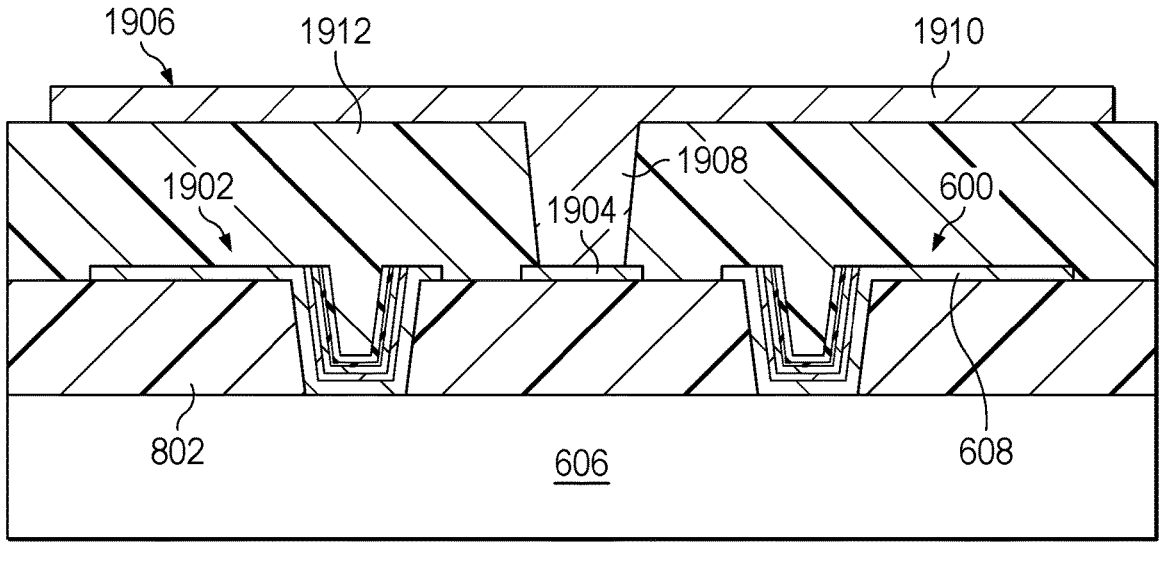

Once the patterning and etching of the first metal layer of block 722 is completed, the resulting structure corresponds to the MEMS structure 600 shown and described above in connection with FIG. 6 except that the sacrificial layer 802 has not yet been removed. However, before the sacrificial layer 802 is removed, additional components associated with a micromirror assembly containing the MEMS structure 600 are formed. Accordingly, at block 724 of FIG. 7, the method includes fabricating additional components in a micromirror assembly. This stage of fabrication is represented in FIG. 19. Specifically, FIG. 19 shows the MEMS structure 600 on the substrate 606 formed with a separate MEMS structure 1902 between which is a hinge 1904 on which a micromirror structure 1906 (including a post 1908 and plate 1910) have been formed. In some examples, the separate MEMS structure 1902 is fabricated during the same processes outlined above for the fabrication of the MEMS structure 600. Further, in some examples, the hinge 1904 corresponds to a portion of the first metal layer 608 separated from other portions during the patterning and etching processes associated with block 722.

The fabrication of the micromirror structure 1906 of FIG. 19 is accomplished through similar processes outlined above and/or any other suitable processes now known or developed in the future. Briefly, such processes include the adding of a second sacrificial layer 1912 above the first sacrificial layer 802 as well as the MEMS structures 600, 1902 and hinge 1904. An opening in the second sacrificial layer 1912 is created to define the location for the post 1908 with the plate 1910 provided on the upper surface of the second sacrificial layer 1912.

Figure 20:
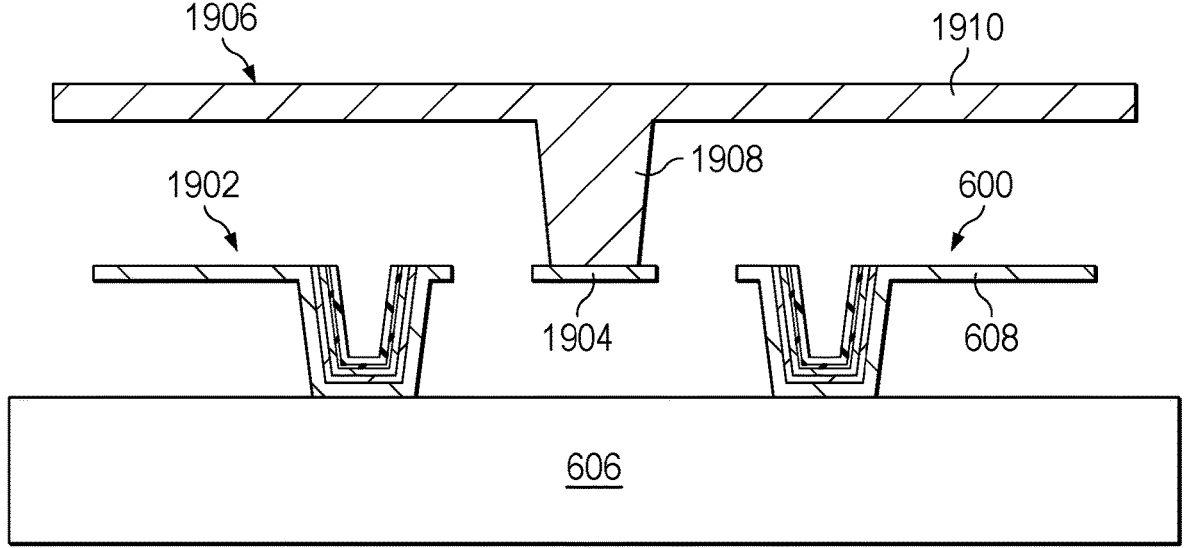

The stage of fabrication corresponding to block 726 of FIG. 7 is represented in FIG. 20. Specifically, at block 724, the method includes removing the sacrificial layers 802, 1912 to release the components of the micromirror assembly. The removal of the sacrificial layers may be accomplished using any suitable technique (e.g., a wet etch process). Once released, the components may be exposed to air in the ambient environment to form native oxide on exposed metal surfaces such that the native oxide 616 appears as shown in FIG. 6. However, for purposes of clarity of illustration, the native oxide 616 on the exterior metal surfaces have been omitted in FIG. 20. After completion of block 726, the example process of FIG. 7 ends.

As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

From the foregoing, it will be appreciated that example systems, methods, apparatus, and articles of manufacture have been disclosed that enable the reduction in stiction between components of MEMS devices that stem from and/or are supported by pillars or vias. This reduction in stiction can improve the performance and/or increase the useful life of such MEMS devices. Further, examples disclosed herein provided added thickness to the walls of such pillars or vias, which provide increased structural integrity and improved electrical properties (e.g., reduced resistivity) for the pillars or vias. While examples described above and detailed in the figures correspond to pillars or vias supporting hinges and/or spring tips in micromirror assemblies of DMDs, teachings disclosed herein are not limited to such applications but can be suitably adapted to reduce stiction of any type of MEMS structures, components, or elements and/or improve the physical and/or electrical properties of pillars or vias support such MEMS structures, components, or elements used in any type of MEMS devices (e.g., contact switches).

Further examples and combinations thereof include the following:

Example 1 includes a microelectromechanical system (MEMS) device comprising a substrate, a via supported by the substrate, the via comprising a first metal layer comprising a material, an arm extending away from and supported by the via, the arm comprising the material, and a second metal layer within the via on the first metal layer, wherein the second metal layer comprises nitrogen.

Example 2 includes the MEMS device of example 1, wherein the second metal layer further comprises titanium.

Example 3 includes the MEMS device of any one examples 1 or 2, wherein there is no native oxide between the second metal layer and the first metal layer.

Example 4 includes the MEMS device of any one examples 1-3, wherein the second metal layer is not on the arm.

Example 5 includes the MEMS device of any one examples 1-4, wherein the MEMS device further comprises a third metal layer within the via on the second metal layer.

Example 6 includes the MEMS device of example 5, wherein the third metal layer comprises aluminum, titanium, or silicon.

Example 7 includes the MEMS device of any one examples 5 or 6, wherein the third metal layer is thicker than the second metal layer.

Example 8 includes the MEMS device of any one examples 5-7, wherein the first metal layer has a first thickness, the second metal layer has a second thickness, and the third metal layer has a third thickness, and wherein the first thickness is greater than a combined thickness of the second and third thicknesses.

Example 9 includes the MEMS device of any one examples —85, further comprising a native oxide layer on the third metal layer and on the arm, and a silicon oxide layer on the native oxide layer in the via.

Example 10 includes the MEMS device of any one examples 1-9, further comprising a layer of silicon oxide within the via, the second metal layer between the layer of silicon oxide and the first metal layer.

Example 11 includes a microelectromechanical system (MEMS) device comprising a substrate, a hinge, a micromirror coupled to the hinge, a via supported by the substrate, the via comprising a first metal layer, and a second metal layer directly on the first metal layer, and a spring tip supported by the via, the spring tip configured to contact an underside of the micromirror responsive to movement of the hinge.

Example 12 includes the MEMS device of example 11, wherein the second metal layer comprises titanium and nitrogen.

Example 13 includes the MEMS device of any one examples 11 or 12, wherein the first metal layer and the spring tip comprise a metal that is different than the second metal layer.

Example 14 includes the MEMS device of any one examples 11-13, further comprising a third metal layer on the second metal layer.

Example 15 includes the MEMS device of example 14, wherein the third metal layer comprises aluminum, titanium, and silicon.

Example 16 includes the MEMS device of any one examples 14 or 15, wherein the third metal layer is thicker than the second metal layer, and the first metal layer is thicker than the third metal layer.

Example 17 includes a method of manufacturing a microelectromechanical system (MEMS) device comprising forming an opening in a sacrificial material supported by a substrate, depositing a first metal layer over the sacrificial material, the first metal layer extending into the opening, depositing a second metal layer on the first metal layer, the second metal layer deposited over the first metal layer within the opening, and removing the second metal layer to expose the first metal layer outside of the opening.

Example 18 includes the method of example 17, wherein depositing the second metal layer and depositing the first metal layer are performed in-situ.

Example 19 includes the method of any one examples 17 or 18, further comprising depositing a third metal layer on the second metal layer, the third metal layer covering the second metal layer within the opening, and removing the third metal layer outside of the opening.

Example 20 includes the method of any one examples 17-19, further comprising patterning the first metal layer to form a spring tip in the first metal layer.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. A microelectromechanical system (MEMS) device comprising:
   a substrate;
   a via supported by the substrate, the via comprising a first conductive layer, the via having a bottom and sidewalls;
   a conductive member extending away from and supported by the via; and
   a second conductive layer in the via over the first conductive layer along the bottom of the via and along the sidewalls of the via, wherein the second conductive layer comprises nitrogen.

2. The MEMS device of claim 1, wherein the second conductive layer further comprises titanium.

3. The MEMS device of claim 1, wherein there is no native oxide between the second conductive layer and the first conductive layer.

4. The MEMS device of claim 1, wherein the second conductive layer is not on the conductive member.

5. The MEMS device of claim 1, wherein the MEMS device further comprises a third conductive layer within the via on the second conductive layer.

6. The MEMS device of claim 5, wherein the third conductive layer comprises aluminum, titanium, or silicon.

7. The MEMS device of claim 5, wherein the third conductive layer is thicker than the second conductive layer.

8. The MEMS device of claim 5, wherein the first conductive layer has a first thickness, the second conductive layer has a second thickness, and the third conductive layer has a third thickness, and wherein the first thickness is greater than a combined thickness of the second and third thicknesses.

9. The MEMS device of claim 5, further comprising:

a native oxide layer on the third conductive layer and on the conductive member; and a silicon oxide layer on the native oxide layer in the via.

10. The MEMS device of claim 9, further comprising a layer of silicon oxide within the via, the second conductive layer between the layer of silicon oxide and the first conductive layer.

11. A microelectromechanical system (MEMS) device comprising:

a substrate;

a hinge;

a micromirror over the hinge; and a via coupling the substrate and the hinge, the via comprising:

a first conductive layer; and a second conductive layer on the first conductive layer.

12. The MEMS device of claim 11, wherein the second conductive layer comprises titanium and nitrogen.

13. The MEMS device of claim 11, wherein the first conductive layer comprises a metal that is different than the second conductive layer.

14. The MEMS device of claim 11, further comprising a third conductive layer on the second conductive layer.

15. The MEMS device of claim 14, wherein the third conductive layer comprises aluminum, titanium, and silicon.

16. The MEMS device of claim 14, wherein the third conductive layer is thicker than the second conductive layer, and the first conductive layer is thicker than the third conductive layer.

17. A method of manufacturing a microelectromechanical system (MEMS) device, the method comprising:

forming an opening in a sacrificial material supported by a substrate;

depositing a first conductive layer over the sacrificial material, the first conductive layer extending into the opening;

depositing a second conductive layer on the first conductive layer, the second conductive layer deposited over the first conductive layer within the opening;

depositing a third conductive layer on the second conductive layer, the third conductive layer covering the second conductive layer within the opening;

removing the third conductive outside of the opening; and removing the second conductive layer to expose the first conductive layer outside of the opening.

18. The method of claim 17, wherein depositing the second conductive layer and depositing the first conductive layer are performed in-situ.

19. A method of manufacturing a microelectromechanical system (MEMS) device, the method comprising:

forming an opening in a sacrificial material supported by a substrate;

depositing a first conductive layer over the sacrificial material, the first conductive layer extending into the opening;

depositing a second conductive layer on the first conductive layer, the second conductive layer deposited over the first conductive layer within the opening;

removing the second conductive layer to expose the first conductive layer outside of the opening; and patterning the first conductive layer to form a spring tip in the first conductive layer.

* * * * *